(12) United States Patent
Herrmann et al.

(10) Patent No.: US 11,428,720 B2
(45) Date of Patent: Aug. 30, 2022

(54) MEASURING ARRANGEMENT AND METHOD OF MEASURING ELECTRICAL SIGNALS

(71) Applicant: SIEMENS AKTIENGESELLSCHAFT, Munich (DE)

(72) Inventors: Hans-Joachim Herrmann, Markt Erlbach (DE); Frank Mieske, Berlin (DE); Matthias Loerke, Basdorf (DE)

(73) Assignee: Siemens Aktiengesellschaft, Munich (DE)

( * ) Notice: Subject to any disclaimer, the term of this patent is extended or adjusted under 35 U.S.C. 154(b) by 705 days.

(21) Appl. No.: 16/278,914

(22) Filed: Feb. 19, 2019

(65) Prior Publication Data

US 2019/0257862 A1 Aug. 22, 2019

(30) Foreign Application Priority Data

Feb. 19, 2018 (EP) ..................................... 18157336

(51) Int. Cl.
*G01R 19/25* (2006.01)
*G05B 11/32* (2006.01)
(Continued)

(52) U.S. Cl.
CPC .......... *G01R 19/2509* (2013.01); *G05B 11/32* (2013.01); *G05B 19/0423* (2013.01);
(Continued)

(58) Field of Classification Search
CPC ................ G01R 19/2509; G05B 11/32; G05B 19/0423; G06F 3/05; H03H 17/0628; H03H 2218/06
See application file for complete search history.

(56) References Cited

U.S. PATENT DOCUMENTS 6,249,235 B1 * 6/2001 Iwasaki .............. H03H 17/0628
331/16
6,906,655 B1 * 6/2005 Cox .......................... G06F 3/05
341/155

(Continued)

FOREIGN PATENT DOCUMENTS

| DE | 10203683 C1 | 8/2003 |
| EP | 1786103 A2 | 5/2007 |
| WO | 2015110150 A1 | 7/2015 |

*Primary Examiner* — Mohamed Barakat
*Assistant Examiner* — Rufus C Point
(74) *Attorney, Agent, or Firm* — Laurence A. Greenberg; Werner H. Stemer; Ralph E. Locher

(57) ABSTRACT

A measuring arrangement acquires signals of alternating electrical magnitudes. A sampling apparatus performs a sampling of the signals to form digital sample values. A clock tracking apparatus adapts a sampling clock used by the sampling apparatus in the light of the frequency of the signal to be sampled. In order to be able to acquire reliably signals of alternating electrical magnitudes even when they have different frequencies, the sampling apparatus samples at least two of the signals each with its own sampling clock and the clock tracking apparatus adapts the sampling clock in the light of the frequency of the signal to be sampled simultaneously for each of these at least two signals. There is also described a corresponding method for measuring electrical signals.

9 Claims, 4 Drawing Sheets

(51) Int. Cl.
  *G05B 19/042* (2006.01)
  *G06F 3/05* (2006.01)
  *H03H 17/06* (2006.01)
(52) U.S. Cl.
  CPC ............ *G06F 3/05* (2013.01); *H03H 17/0628* (2013.01); *H03H 2218/06* (2013.01)

(56) References Cited

U.S. PATENT DOCUMENTS

| | | | |
|---|---|---|---|
| 7,738,615 B2 | 6/2010 | Mizutani | |
| 7,956,694 B1* | 6/2011 | Wilson | H05B 39/08 331/12 |
| 9,508,484 B2* | 11/2016 | Scholz | H01F 27/2804 |
| 9,917,662 B2 | 3/2018 | Jurisch | |
| 2003/0014200 A1* | 1/2003 | Jonker | G01R 21/133 702/60 |
| 2006/0083169 A1* | 4/2006 | Wiese | H04N 21/242 370/238 |
| 2007/0046507 A1* | 3/2007 | Hirano | H03H 17/0621 341/61 |
| 2008/0120521 A1* | 5/2008 | Poisson | G06F 11/2294 714/26 |
| 2011/0271007 A1* | 11/2011 | Wang | H04L 45/64 709/238 |
| 2012/0081153 A1* | 4/2012 | Carter | H02J 13/0006 327/91 |
| 2012/0162133 A1* | 6/2012 | Chen | G06F 3/04184 345/174 |
| 2014/0043012 A1* | 2/2014 | Fischer | G11C 27/024 324/76.11 |
| 2015/0318696 A1* | 11/2015 | Ochsenfeld | H02J 3/381 700/287 |
| 2016/0011305 A1* | 1/2016 | Koptenko | G01S 7/52047 367/7 |
| 2018/0003819 A1* | 1/2018 | Koptenko | G01S 15/8927 |
| 2018/0292447 A1* | 10/2018 | Piyasinghe | G01R 31/088 |

* cited by examiner

MEASURING ARRANGEMENT AND METHOD OF MEASURING ELECTRICAL SIGNALS

CROSS-REFERENCE TO RELATED APPLICATION

This application claims the priority, under 35 U.S.C. § 119, of European patent application EP 18157336.1, filed Feb. 19, 2018; the prior application is herewith incorporated by reference in its entirety.

BACKGROUND OF THE INVENTION

Field of the Invention

The invention relates to a measuring arrangement with at least two measurement inputs for the capture of signals of alternating electrical magnitudes, a sampling apparatus that is arranged following the measurement inputs with which a sampling of the signals is performed while forming digital sample values, and a clock tracking apparatus that performs an adaptation of a sampling clock used by the sampling device for the sampling in the light of the frequency of the signal to be sampled.

The invention also relates to a method for the measurement of electrical signals with such a measuring arrangement.

A measuring arrangement with which a tracking of the sampling clock used for sampling the signals is performed for the correct sampling of the electrical signals, for example signals of an alternating current or an alternating voltage, is known from German patent DE 102 03 683 C1. The frequency of the signal to be sampled is determined for this purpose, and, depending on the frequency, an adjustment of the sampling clock is performed with a control arrangement. The sampling clock is supplied to a sampling apparatus which is configured for sampling the electrical signal according to the sampling clock.

A measurement of electrical signals with tracking of the sampling clock is used, for example, in devices that serve for the observation, monitoring and/or protection of equipment or processes, for example an electrical energy supply network. In order to achieve a high measurement precision with those devices, a sampling clock tracking that operates over a wide frequency range of the signal to be sampled is usually realized. The sampling clock tracking is carried out centrally for the device, and applied equally to all the measurement inputs. The formation of the same number of sample values every time for each oscillation period of the signal can be achieved through the tracking of the sampling clock.

The central sampling clock tracking is then always adequate if the signals at the measurement inputs exhibit matching frequencies. Depending on the application, situations can however arise in which the measurement points at which the signals are captured are galvanically isolated from one another, and can thus exhibit different frequencies. In energy supply networks, for example, there are states of the equipment or grid in which some measurement points are temporarily galvanically isolated from one another (e.g. by opened power switches). Different frequencies of the parts of the equipment are thereby possible.

Depending on which signal is used for tracking the sampling clock, the sampling frequency tracked in the device arises in such a way that some measurement inputs are operated with a correct sampling clock and other measurement inputs with an incorrect sampling clock. Measurement errors that can lead to malfunctions of the device (e.g. to unwanted protection triggering of the protection devices for energy supply networks, protection failures or incorrect triggering of recorders) result from incorrect tracking of the sampling clock.

In respect of the capture of a plurality of signals with the measuring arrangement, the above-mentioned German patent DE 102 03 683 C1 proposes that the above-described procedure is carried out separately for each signal, in that the signals are applied to the control arrangement for sampling clock tracking via a selector switch.

SUMMARY OF THE INVENTION

It is accordingly an object of the invention to provide a measuring device and a measuring method which overcome a variety of disadvantages of the heretofore-known devices and methods of this general type and which renders it possible to acquire signals of alternating electrical magnitudes reliably when they have different frequencies.

With the foregoing and other objects in view there is provided, in accordance with the invention, a measuring arrangement, comprising:

at least two measurement inputs for capturing signals of alternating electrical magnitudes;

a sampling apparatus connected to said measurement inputs, said sampling apparatus being configured to sample at least two of the signals, each with its own sampling clock, and forming digital sample values; and a clock tracking apparatus configured to adapt a sampling clock used by said sampling apparatus for sampling in dependence on a frequency of the signal to be sampled simultaneously for each of the at least two signals.

In other words, the objects of the invention are achieved through a measuring arrangement of the type mentioned at the beginning in which the sampling apparatus is configured to sample at least two of the signals, each with its own sampling clock, wherein the clock tracking apparatus is configured to perform an adaptation of the sampling clock in the light of the frequency of the signal to be sampled simultaneously for each of these at least two signals.

According to the invention, a plurality of signals with different frequencies can thus be sampled simultaneously with a correctly tracked sampling clock. For this purpose the clock tracking apparatus is therefore designed to carry out a respective, appropriate sampling clock tracking for each signal. This has the advantage that each signal is correctly sampled even in the case of signals with frequencies that differ significantly from one another.

According to an advantageous embodiment of the invention, the measuring arrangement is part of a device for the observation, monitoring and/or protection of an electrical energy supply network.

Such devices in particular are namely increasingly also employed for the acquisition of a plurality of signals that are captured at different measurement points in the energy supply network. These signals do not necessarily here have to have the same frequency, since, for example, a galvanic isolation (for example a temporarily opened switch) is present between the measurement points. It is thus of great importance to avoid measurement inaccuracies that result from an incorrect tracking of the sampling clock. Errors in the measurement of electrical magnitudes in energy supply networks can namely lead to parts of the network being unintentionally switched off, or to inadequate functions of the protection system, so that the energy supply network can no longer be operated safely and reliably.

It is proposed in this connection according to a further advantageous form of embodiment of the measuring arrangement according to the invention, that the measurement inputs are divided into different tracking groups, wherein respective measurement inputs of such signals whose frequencies, as a result of the particular features of the energy supply network, match are grouped into the same tracking group, and the clock tracking apparatus is configured to perform an adaptation of the sampling clock for each tracking group.

Specific measurement inputs can advantageously be brought together into groups in this way, so that a clock tracking does not have to be carried out separately for each measurement input.

Concretely, it can be provided in this connection that such measurement inputs to which signals that are acquired at measurement points of the energy supply network that can be galvanically separated from one another are assigned, are assigned to different tracking groups.

Signals that are acquired at measurement points that are galvanically connected to one another namely usually exhibit matching frequencies. Provided no switching apparatus that can create a temporary isolation point is located between such measurement points, the measurement inputs of such signals can be grouped together into one group.

In accordance with an added feature of the invention, the tracking groups can be specified by an adjustment of the arrangement on the part of the user. The adjustment can then, for example, be performed in the context of a device parameterization. The user analyzes the associated network plans for this purpose, and sets up the tracking groups in an appropriate manner.

In the alternative, that the tracking groups are formed automatically by the measuring arrangement on the basis of the topology of the energy supply network and/or of the state of switching apparatuses of the energy supply network.

This enables a flexible group formation that can adapt dynamically to the network state at the time. Through the automatic analysis of a network plan present in machine-readable form, the topology can be recognized in such a way that such measurement inputs whose signals cannot be galvanically disconnected from one another by an isolation point are brought together to form tracking groups. A dynamic adaptation to temporarily opened switching apparatuses can, moreover, be carried out, so that in the presence of an opened switching apparatus, the signals that are then galvanically isolated are handled in different tracking groups. After the closure of the switching apparatus, a handling can then take place in the same tracking group.

The sampling clock tracking can be designed particularly efficiently if the clock tracking apparatus is configured to determine in each case the frequency of one signal of each tracking group, and to perform the adaptation of the sampling clock for all the measurement inputs belonging to the respective tracking group on the basis of the frequency determined.

The complexity for the frequency measuring can be reduced by this to one signal per tracking group.

According to a further advantageous form of embodiment, it is provided that the measuring arrangement comprises a control apparatus that carries out at least two observation, protection and/or monitoring functions, and that exclusively such sample values as are obtained by sampling signals at measurement inputs that are assigned to the same tracking group are supplied to each observation, protection and/or monitoring function.

In this way it is possible to ensure that only such signals whose frequencies match are evaluated by a single observation, protection and/or monitoring function. The mixing of signals that have been sampled with different sampling clocks could, namely, lead to malfunction of the respective function.

In accordance with an advantageous feature of the invention, the device is a local protection device or a central data processing installation.

Local protection devices are employed physically close to the respective measurement points, and evaluate the received signals non-centrally. On the establishment of a fault state with reference to the energy supply network, countermeasures such as, for example, the opening of a switching apparatus and/or the generation of an alarm signal are performed by the respective protection device. A central data processing installation can, for example, be a central protection installation that is arranged in a control room of the energy supply network and to which the signals are supplied in analog or digital form (e.g. via a so-called process bus). The central protection installation then carries out an analysis of the network state and, if appropriate, transmits a switching command to one or a plurality of switching apparatuses. A cloud computer system that consists of one or a plurality of computing apparatuses and which offers the protection function as a service may also be considered as a central data processing installation.

With the above and other objects in view there is also provided, in accordance with the invention, a method of measuring electrical signals, the method comprising:

acquiring signals of alternating electrical magnitudes by way of at least two measurement inputs of a measuring arrangement;

sampling at least two of the signals, each signal with its own sampling clock, to form digital sample values with a sampling apparatus of the measuring arrangement that is arranged following the measurement inputs; and adapting a sampling clock that is used by the sampling apparatus for the sampling with a clock tracking apparatus of the measuring arrangement in regards to a frequency of the signals to be sampled, and thereby adapting the sampling clock simultaneously for each of the at least two signals to be sampled.

In other words, the objects of the invention are also achieved by a method for measuring electrical signals wherein signals of alternating electrical magnitudes are acquired with at least two measurement inputs of a measuring arrangement, a sampling of the signals is performed while forming digital sample values with a sampling apparatus of the measuring arrangement that is arranged following the measurement inputs, and an adaptation of a sampling clock used by the sampling device for the sampling is performed by a clock tracking apparatus of the measuring arrangement in the light of the frequency of the signal to be sampled.

According to the invention, at least two of the signals are sampled with the sampling apparatus each with its own sampling clock, and the clock tracking apparatus performs an adaptation of the sampling clock in the light of the frequency of the signal to be sampled simultaneously for each of these at least two signals.

All of the statements made above and below with regard to the measuring arrangement according to the invention apply to the method according to the invention and vice versa in an appropriate manner; in particular, the method according to the invention can be employed with every and any form of embodiment or a combination of any forms of embodiment of the measuring arrangement. Reference is also made to the advantages described for the measuring arrangement according to the invention in respect of the advantages of the method according to the invention.

Other features which are considered as characteristic for the invention are set forth in the appended claims.

The invention is explained below in more detail with reference to an exemplary embodiment. The specific design of the exemplary embodiment is in no way to be understood as restrictive for the general design of the measuring arrangement according to the invention and of the method according to the invention; rather is it possible for individual design features of the exemplary embodiment to be combined in an arbitrary manner freely with one another and with the features described above. Specifically, although the invention is illustrated and described herein as embodied in a measuring arrangement and method for the measurement of electrical signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
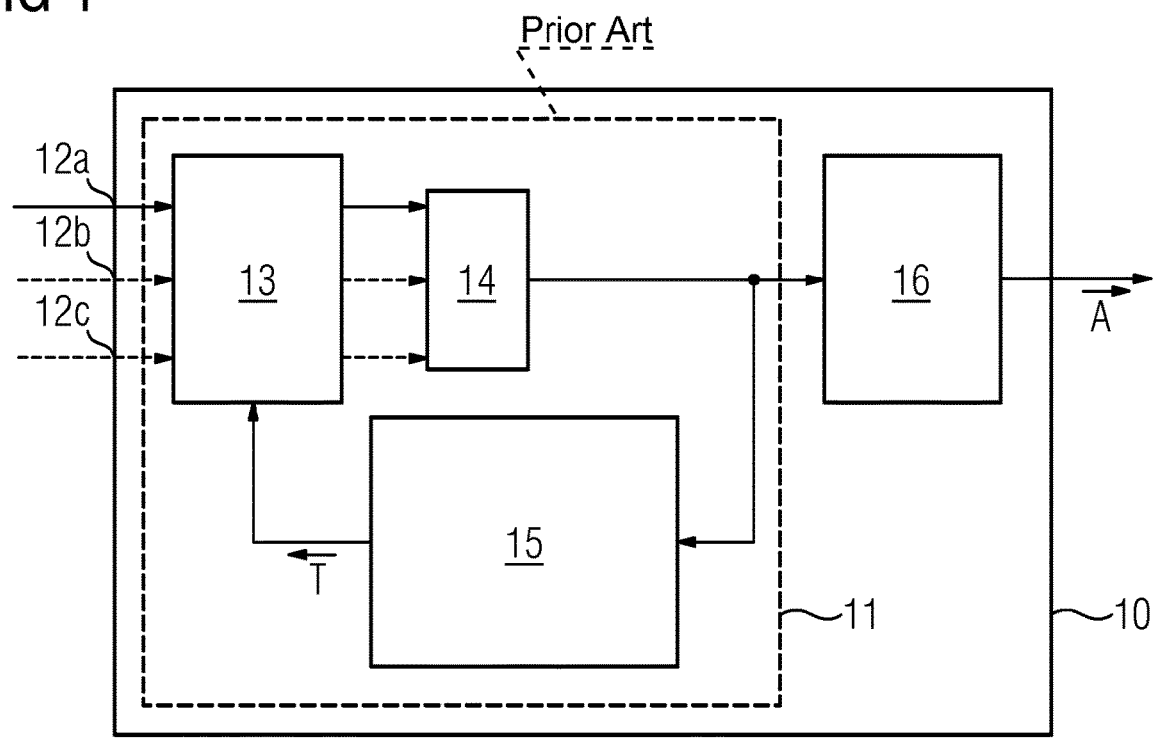
FIG. 1 shows a device with a measuring arrangement with sampling clock tracking according to the prior art.

Referring now to the figures of the drawing in detail and first, particularly, to FIG. 1 thereof, there is shown a device 10 with a measuring arrangement 11 according to the prior art. The measuring arrangement 11 comprises a measurement input 12a. Further measurement inputs 12b and 12c can optionally be provided. A sampling apparatus 13 is arranged following the measurement input 12a (and the optional measurement inputs 12b and 12c). A clock tracking apparatus 15 is arranged following the sampling apparatus 13 on the output side via an optional selector switch 14. A clock output of the clock tracking apparatus 15 is connected to a clock input of the sampling apparatus 13. An observation, protection and/or monitoring function 16 of the device 10 is also arranged following the measuring arrangement 11.

The measuring arrangement 11 is operated as described below. The signal of an alternating electrical magnitude that is present at the measurement input 12a is sampled in the usual way with the sampling apparatus 13. A sampling clock which corresponds to or is derived from a clock signal T present at the clock input of the sampling apparatus is used here for the sampling. Since the signal to be sampled can be subject to fluctuations in terms of its frequency, the sampling clock used is adapted in the light of the frequency of the signal, so that the number of sampled values in each period of the signal is constant. The frequency of the signal is determined in a usual manner by the clock tracking apparatus 15 for this purpose, and the clock signal T is derived from it. This is supplied to the sampling apparatus 13 for adaptation of the sampling clock used for the sampling.

The concrete mode of operation of the adaptation of the sampling clock may, for example, correspond to that which is explained in the above-mentioned German patent DE 102 03 683 C1.

The sampled signal is, moreover, supplied to the observation, protection and/or monitoring function 16 of the device 10 which carries out an evaluation of the signal and, if relevant, outputs an output signal A that is derived from the result of the evaluation. The device 10 can, for example, be a protection device for protecting and monitoring an electrical energy supply network. The function 16 can in this case be a protection function, for example a remote protection function or an overcurrent protection function which, as an output signal A, outputs an error signal whenever a fault is established in the energy supply network.

Inasmuch as further input signals 12b and 12c are supplied in addition to the input signal 12a to the sampling apparatus 13, the signal to be evaluated at any one time can be selected by means of the selector switch 14. The tracking of the sampling clock is adjusted in each case to the frequency of the signal selected by the selector switch 14.

Only one signal can be evaluated at any one time with the measuring arrangement 11 known from the prior art.

Figure 2:
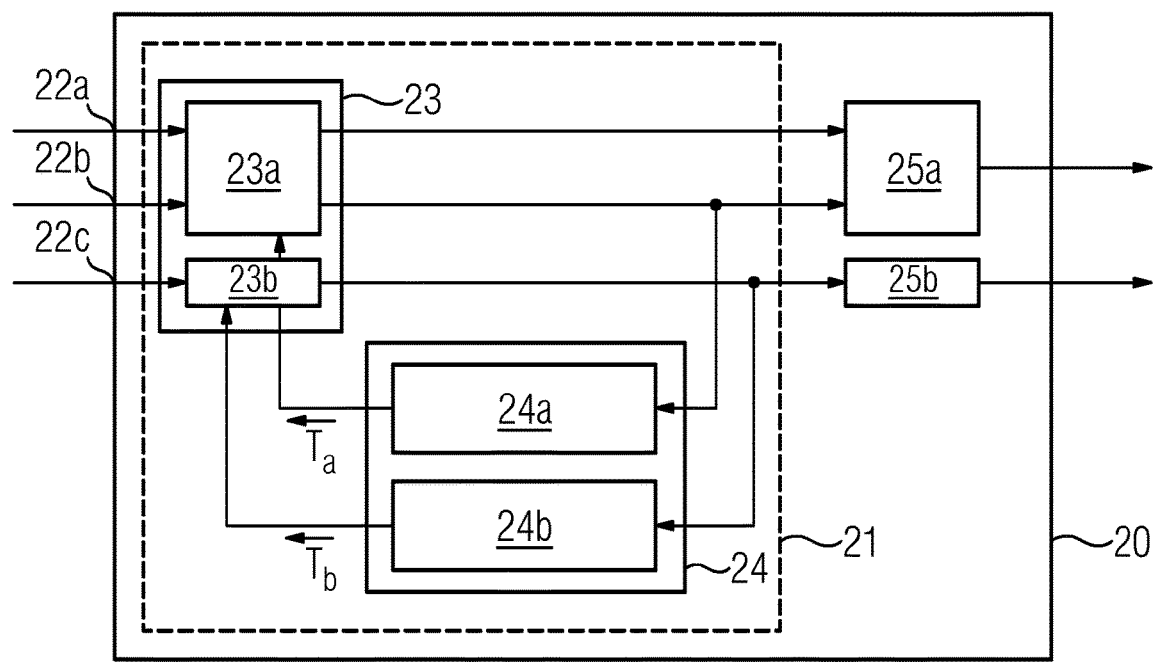
FIG. 2 shows a device with a measuring arrangement according to the invention with sampling clock tracking.

A measuring arrangement according to FIG. 2 is proposed in order to be able to evaluate simultaneously a plurality of signals, each of which can have different frequencies. FIG. 2 shows a device 20 with a measuring arrangement 21. The general structure of the measuring arrangement 21 corresponds to the structure explained in connection with FIG. 1 relating to the measuring arrangement 11, so that considerations below will largely relate to the differentiating features.

The measuring arrangement 21 also comprises measurement inputs 22a-c through which signals of alternating electrical magnitudes can be supplied to the measuring arrangement 21. A sampling apparatus 23, which is connected at the output side to a clock tracking apparatus 24, is arranged following the measurement inputs 22a-c.

In contrast with the measuring arrangement 11 according to FIG. 1, the sampling apparatus 23 comprises a plurality of sampling components, from which the sampling components 23a and 23b are shown by way of example in FIG. 2. The measurement inputs 22a and 22b are here assigned to the first sampling component 23a, while the second sampling component 23b is assigned to the measurement input 22b. The clock sampling apparatus 24 also comprises a plurality of clock tracking components corresponding to the number of sampling components, of which the clock tracking components 24a and 24b are shown by way of example in FIG. 2.

The assignment of the measurement inputs 22a-c to the individual sampling components 23a, 23b of the sampling apparatus 23 is done in such a way that in each case such measurement inputs to which signals whose frequencies match are applied are brought together into a so-called "tracking group." The measurement inputs of a tracking group are in each case assigned to one sampling component 23a, 23b of the sampling apparatus 23. In the present case, the signals at the measurement inputs 22a and 22b exhibit the same frequency, and are therefore brought together into one tracking group which is assigned to the sampling component 23a. The signal at the measurement input 23c can exhibit a frequency differing therefrom, and therefore belongs to a second tracking group that is assigned to the sampling component 23b.

When assigning the measurement inputs to the tracking groups, consideration is given to those measurement points at which the respective signals that are supplied to the measuring arrangement are captured. Such measurement points as are permanently galvanically connected to one another are assigned to the same tracking group, since it is assumed that the signals captured there in each case match in terms of the frequencies. Measurement points that are galvanically isolated from one another or can be galvanically isolated from one another—for example by means of switching apparatus—are assigned to different tracking groups. The assignment can, here, for example take place through adjustment on the part of the user during the parameterization of the device 20. An automatic assignment can also take place as an alternative. In the case of an electrical energy supply network automated by the device, this can be done with reference to the topology and/or to the state of the switching apparatuses in the energy supply network. The assignment can be statically specified or—in particular in the case of automatic assignment—be performed dynamically.

For each tracking group, the clock tracking apparatus 24 comprises a clock tracking component 24a, 24b. The frequency of the signals of the respective tracking group is determined for this purpose by each clock tracking component 24a, 24b. The frequency determination preferably only takes place in each case for one signal of the respective tracking group, in order to minimize the complexity for the frequency measurement. A respective clock signal is generated by the clock tracking apparatus 24 on the basis of the determined frequency, and is supplied to the sampling apparatus 23.

In the concrete case of FIG. 2, the frequency of the signal present at the measurement input 22b is determined by the clock tracking component 24a. Since the measurement inputs 22a and 22b are assigned to the same tracking group, the frequency determined can also be used for the signal present at measurement input 22a. On the basis of the frequency determined, the clock tracking component 24a determines a clock signal $T_a$ which is passed to the sampling component 23a. A sampling of the signals present at the measurement inputs 22a and 22b can thus be performed with a sampling clock adapted to the signal frequency by the clock signal $T_a$. The frequency of the signal present at the measurement input 22c is determined correspondingly with the clock tracking component 24b. On the basis of the frequency determined, the clock tracking component 24b determines a clock signal $T_b$ which is passed to the sampling component 23b. A sampling of the signal present at the measurement input 22c can thus be performed with a sampling clock adapted to the signal frequency by the clock signal $T_b$.

The concrete mode of operation of the adaptation of the sampling clock is not relevant for the implementation of the measuring arrangement. It can, for example, correspond to that which is explained in the above-mentioned German patent DE 102 03 683 C1.

The signals sampled with the respectively adapted sampling clock are passed for further evaluation to observation, protection and/or monitoring functions 25a and 25b that are executed by a control apparatus of the device 20. It is necessary to ensure here that only such signals as belong to the same tracking group are passed in each case to an observation, protection and/or monitoring function.

The number and division of the tracking groups is to be adapted in each case to the equipment at which the signals are captured with the device. The number of sampling components and of clock tracking components is to be chosen appropriately in accordance with the number of tracking groups.

The sampling components and clock tracking components can be implemented as hardware or as software. In the case of an implementation as software, appropriate instances of, for example, digital filters and other functional modules can be created. In the case of a software-based implementation in particular, a dynamic adaptation of the tracking groups can be realized very easily.

Figure 3:
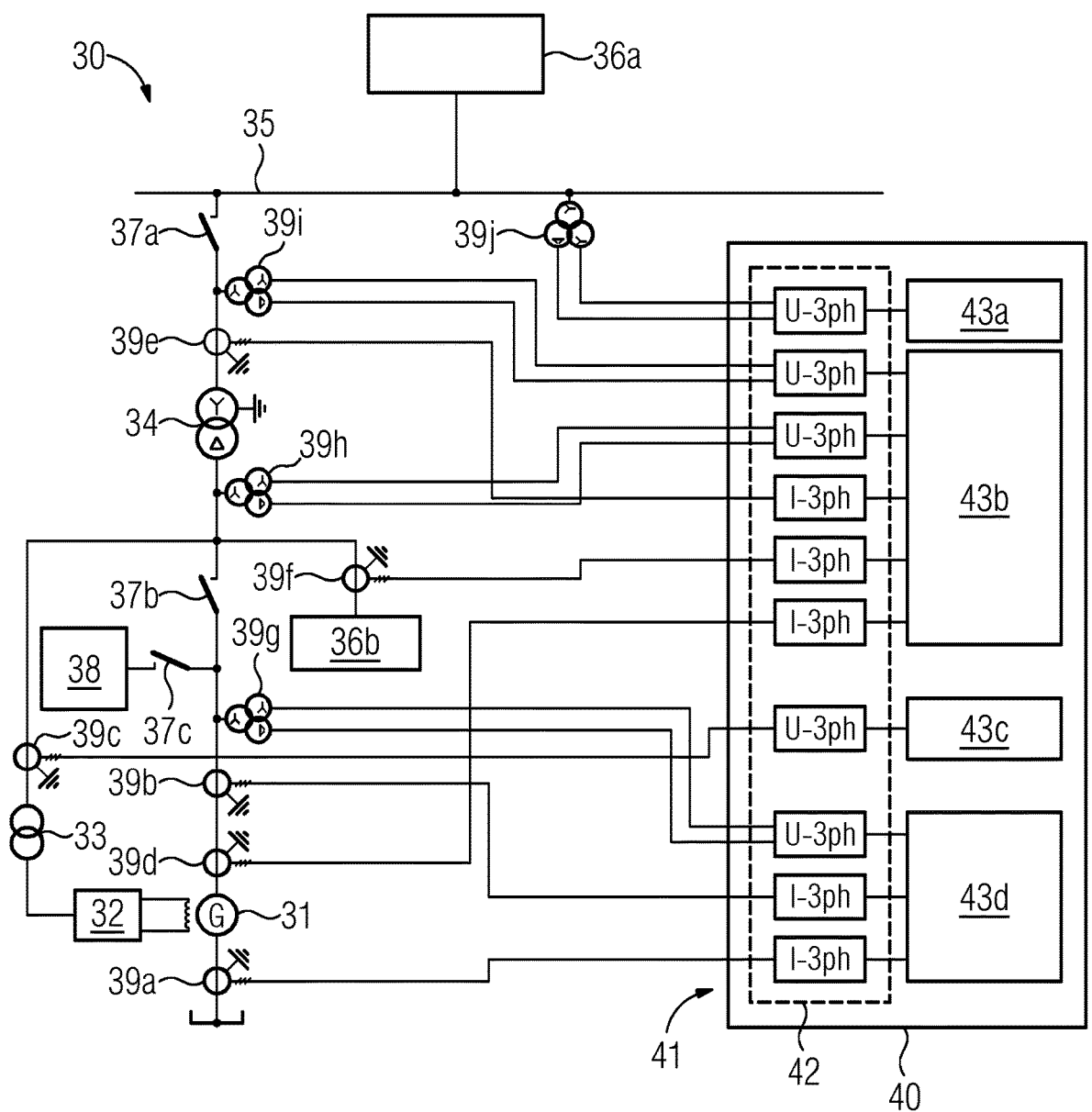
FIG. 3 shows an exemplary embodiment of an electrical energy supply network with a device with a measuring arrangement.
Figure 4:
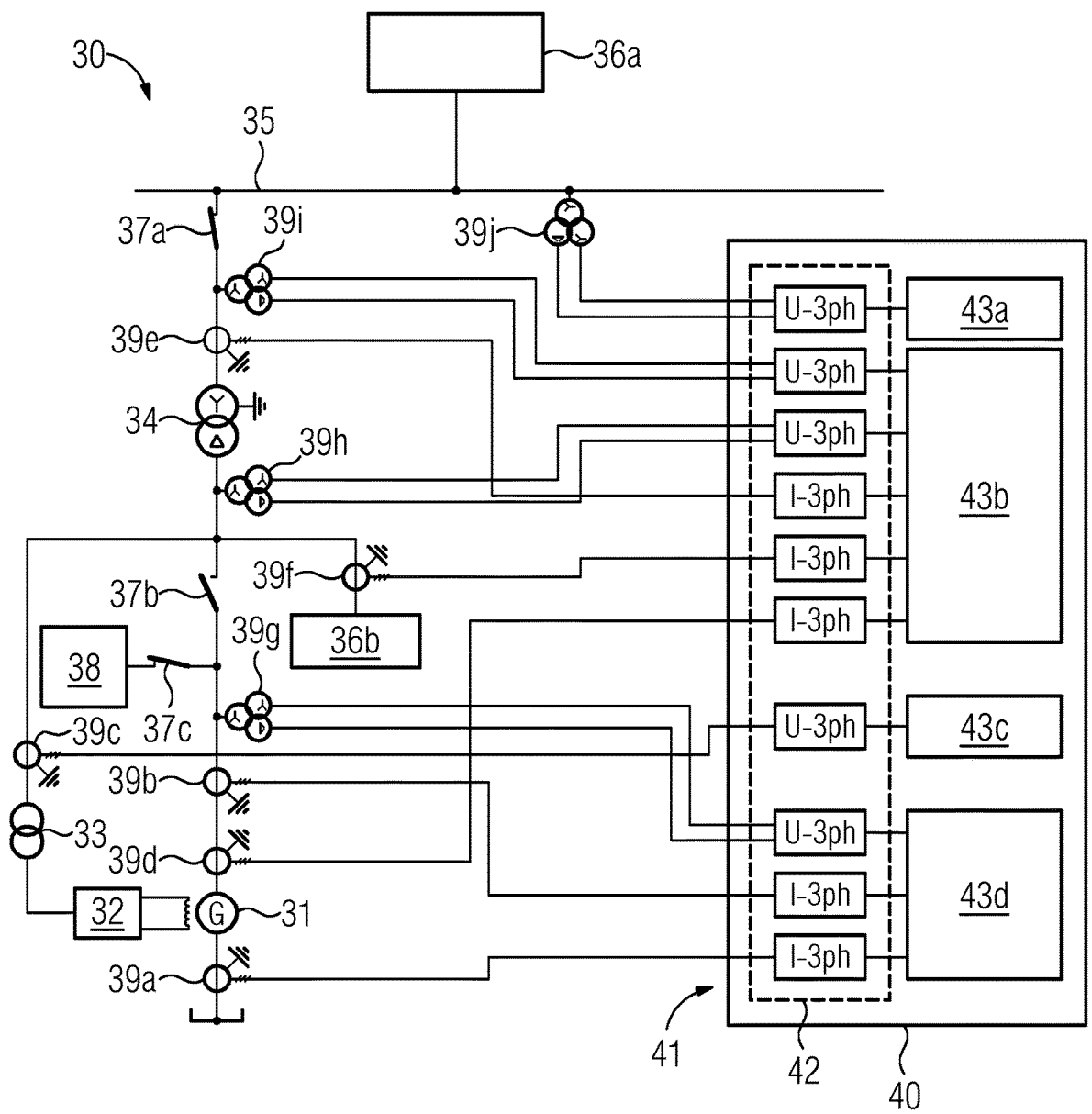
FIG. 4 shows the electrical energy supply network according to FIG. 3 in a first exemplary switched state.
Figure 5:
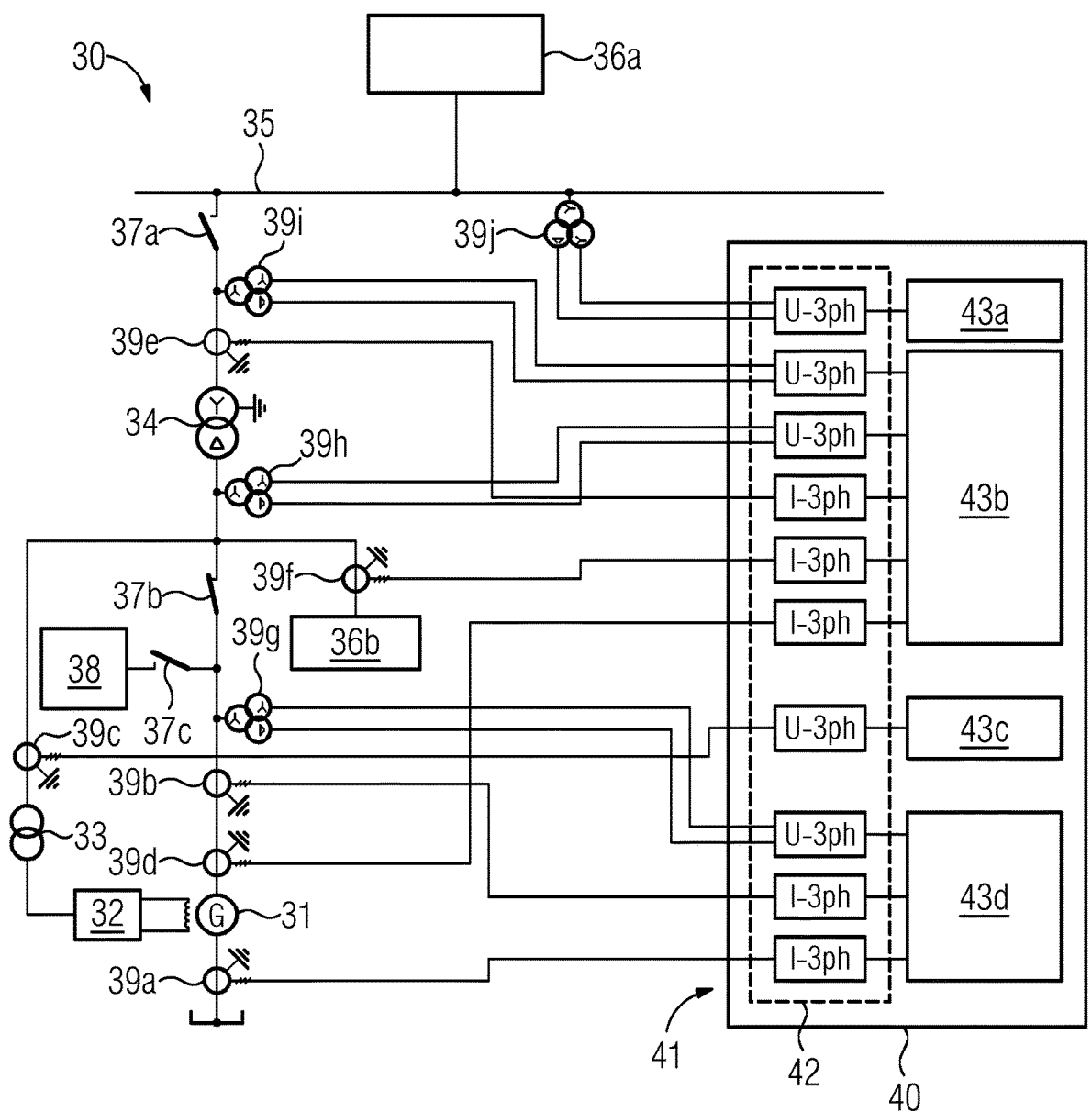
FIG. 5 shows the electrical energy supply network according to FIG. 3 in a second exemplary switched state.

A detailed example of an energy supply network 30 with a power plant unit that is monitored by a protection device 40 is shown in FIGS. 3-5.

The energy supply network 30 here comprises a generator 31 that can be started up by a field coil 32 that is fed by an excitation transformer 33. The power plant unit is connected via a generator transformer 34 to a busbar 35 that is connected to the rest of the grid 36a, which is not shown in detail in FIGS. 3-5. Reference sign 36b identifies an auxiliary requirement network of the power plant.

The power plant unit can be isolated from the busbar by means of a high-voltage power switch 37a. The generator 31 can itself be disconnected from the generator transformer 34 by means of a generator power switch 37b.

A start-up converter 38 can furthermore be connected to the power plant unit via a converter-power switch 37c.

The energy supply network 30 comprises a large number of measurement points at which alternating electrical magnitudes are acquired with sensors. Concretely, a first current converter 39a is provided for the capture of a three-phase current signal ("I-3ph"), a second current converter 39b is provided for the capture of a three-phase current signal, a third current converter 39c is provided for the capture of a three-phase current signal, a fourth current converter 39d is provided for the capture of a three-phase current signal, a fifth current converter 39e is provided for the capture of a three-phase current signal, and a sixth current converter 39f is provided for the capture of a three-phase current signal. Moreover, a first voltage converter 39g is provided for the capture of a three-phase voltage signal ("U-3ph"), a second voltage converter 39h is provided for the capture of a three-phase voltage signal, a third voltage converter 39i is provided for the capture of a three-phase voltage signal and a fourth voltage converter 39j is provided for the capture of a three-phase voltage signal.

The signals are supplied to corresponding measurement inputs 41 of the protection device 40. The protection device 40 comprises a measuring arrangement 42 designed in accordance with the explanations for FIG. 2, with sampling clock tracking which, for the sake of clarity, is not shown in detail. The protection device 40 furthermore comprises observation, protection and/or monitoring functions 43a-d which serve for the analysis of the signals present at the measurement inputs 41 of the protection device 40. For example, the function 43a can be a voltage and frequency protection, the function 43b a transformer protection and a line protection (high-voltage side), the function 43c can be an overcurrent and overload protection, and the function 43d can be a generator protection. Other functions are, of course, are also possible.

The power switches 37a-c present in the energy supply network 30 permit operating states in which individual measurement points are galvanically isolated from one another. For this reason there is a need to divide the measurement inputs into tracking groups. In the concrete example, the topology and possible disconnections make three tracking groups necessary. The measurement inputs 41 are therefore assigned to different tracking groups. The measurement input assigned to the fourth voltage converter 39j is thus assigned alone to a first tracking group. The respective measurement inputs that are assigned to the second voltage converter 39h and to the third voltage converter 39i, as well as the third current converter 39c and the fourth current converter 39d, the fifth current converter 39e and the sixth current converter at 39f are assigned to a second tracking group. Finally, those measurement inputs to which the first voltage converter 39q as well as the first current converter 39a and the second current converter 39b are assigned to a third tracking group.

Different switching states are possible when starting up and running down the power plant unit referred to by way of example in FIG. 3, and after protections have been triggered. Different switching states which lead to different frequencies, and thereby illustrate the necessity of forming groups, are to be explained in FIGS. 4 and 5.

In this respect, FIG. 4 shows a first scenario in which the high-voltage power switch 37a is closed and the generator power switch 37b is open. The network 36a supplies the auxiliary power requirement of the power plant network 36b through the generator transformer 34. The signals of the tracking groups 1 and 2 explained above thus have matching frequencies. The converter power switch 37c is closed, and the generator 31, with the connected gas turbine, is being run up by the start-up converter 38 starting from 0 Hz. The frequency of the signals belonging to tracking group 3 are thus significantly different from those of the signals of tracking groups 1 and 2. The excitation is fed via the excitation transformer 33, which is connected to the low-voltage side of the generator transformer 34. The third current converter 39c is thus to be assigned to tracking group 2, and has a direct connection to the required protection functions (overcurrent, overload). The fourth current converter 39d presents a special case. Although it is located below the generator-power switch 37b, it is to be assigned to tracking group 2. When the generator power switch 37b is open and feed is taking place via the start-up converter 38, a current is fed in that does not correspond to Kirchhoff's current law (transformer differential protection) as is used in the transformer protection. This measurement point is to be "released" for the transformer protection, i.e. removed from the measurement. The transformer protection is, alternatively, to be set to be less sensitive.

In the scenario illustrated in FIG. 5, the power plant unit is first connected to the network 36a. The protection is triggered (e.g. by means of the power plant disconnection protection) as a result of a network short-circuit that is not switched off in good time. The near short-circuit signifies a release of load from the generator 31, and thus an acceleration of the rotor. The high-voltage power switch 37a is opened by the triggering of the protection. After the high-voltage power switch 37a has opened, the acceleration of the rotor results in a higher frequency of the power plant unit. The frequencies of the network 36a and of the power plant unit are thus different. In order to measure the variables at the busbar 35 accurately, the fourth voltage converter 39j is to be assigned to its own tracking group, tracking group 1. In this example, tracking groups 2 and 3 have the same frequency. The speed regulation of the power plant unit brings its frequency again toward the network frequency, and the power plant unit can be re-synchronized.

Although the invention is described above with reference to exemplary embodiments which have a local protection device as their object, it is also possible within the scope of the invention for the measuring arrangement to be a component of a central data processing installation. This allows applications such as a central plant protection, process bus applications or cloud-based services to be realized The use of an individual clock tracking for such respective signals that could exhibit different frequencies is fundamental. A simultaneous clock tracking for all signals can thus be achieved. This can, for example, take place through the formation of tracking groups as explained above.

Advantages of the measuring arrangement described include, amongst other things, lower hardware costs, since a single device can be used for more complex equipment implementations. Through the formation of tracking groups and the assignment of the measurement inputs to these tracking groups, a high measurement accuracy is also achieved with galvanically isolated plant parts, and malfunctions are avoided.

Although the invention is illustrated and described more closely above in detail through preferred exemplary embodiments, the invention is not restricted by the disclosed examples, and other variations can be derived therefrom by a person skilled in the art without leaving the protective scope of the following patent claims.

The invention claimed is:
1. A measuring arrangement, comprising:
    at least two measurement inputs for capturing signals of alternating electrical magnitudes;
    a sampling apparatus connected to said measurement inputs, said sampling apparatus being configured to sample at least two of the signals, each with its own sampling clock, and forming digital sample values; and
    a clock tracking apparatus configured to adapt a sampling clock used by said sampling apparatus for sampling in dependence on a frequency of the signal to be sampled simultaneously for each of the at least two signals;
    wherein said at least two measurement inputs are divided into different tracking groups;
    wherein respective measurement inputs of such signals whose frequencies, as a result of particular features of the energy supply network, match are grouped into a common tracking group;
    wherein said clock tracking apparatus is configured to perform an adaptation of the sampling clock for each tracking group; and
    wherein the measuring arrangement is a part of a device for observing, monitoring and/or protecting an electrical energy supply network.

2. The measuring arrangement according to claim 1, wherein respective measurement inputs to which signals that are acquired at measurement points of the energy supply network that can be galvanically separated from one another, are assigned to different tracking groups.

3. The measuring arrangement according to claim 1, wherein the tracking groups are specified by a user-defined adjustment of the measuring arrangement.

4. The measuring arrangement according to claim 1, wherein the tracking groups are formed automatically on a basis of a topology of the energy supply network and/or of a state of switching apparatuses of the energy supply network.

5. The measuring arrangement according to claim 1, wherein said clock tracking apparatus is configured to determine in each case a frequency of one signal of each tracking group, and to adapt the sampling clock for all the measurement inputs belonging to the respective tracking group based on the frequency determined by said clock tracking apparatus.

6. The measuring arrangement according to claim 1, further comprising a control apparatus configured to carry out at least two observation, protection and/or monitoring functions; and
   wherein exclusively such sample values as are obtained by sampling signals at respective said measurement inputs that are assigned to the common tracking group are supplied to each observation, protection and/or monitoring function.

7. The measuring arrangement according to claim 1, wherein said device for observing, monitoring and/or protecting an electrical energy supply network is a local protection device or a central data processing installation.

8. The measuring arrangement according to claim 1, wherein said device for observing, monitoring and/or protecting an electrical energy supply network is a local protection device or a central data processing installation.

9. A method of measuring electrical signals, the method comprising:

acquiring signals of alternating electrical magnitudes by way of at least two measurement inputs of a measuring arrangement;

sampling at least two of the signals, each signal with its own sampling clock, to form digital sample values with a sampling apparatus of the measuring arrangement that is arranged following the measurement inputs; and adapting a sampling clock that is used by the sampling apparatus for the sampling with a clock tracking apparatus of the measuring arrangement in regards to a frequency of the signals to be sampled, and thereby adapting the sampling clock simultaneously for each of the at least two signals to be sampled;

wherein said at least two measurement inputs are divided into different tracking groups;

wherein respective measurement inputs of such signals whose frequencies, as a result of particular features of the energy supply network, match are grouped into a common tracking group;

wherein said clock tracking apparatus is configured to perform an adaptation of the sampling clock for each tracking group; and wherein the measuring arrangement is a part of a device for observing, monitoring and/or protecting an electrical energy supply network.

* * * * *